United States Patent
Vovos et al.

(10) Patent No.: US 12,174,226 B2
(45) Date of Patent: Dec. 24, 2024

(54) REDUNDANT VERIFIABLE HIGH VOLTAGE MEASUREMENT PORT FOR TRACTION INVERTER AND HIGH VOLTAGE DISTRIBUTION

(71) Applicant: BAE Systems Controls Inc., Endicott, NY (US)

(72) Inventors: Robert J. Vovos, Vestal, NY (US); Arthur P. Lyons, Maine, NY (US)

(73) Assignee: BAE Systems Controls Inc., Endicott, NY (US)

( * ) Notice: Subject to any disclaimer, the term of this patent is extended or adjusted under 35 U.S.C. 154(b) by 94 days.

(21) Appl. No.: 18/141,111

(22) Filed: Apr. 28, 2023

(65) Prior Publication Data
US 2024/0361363 A1    Oct. 31, 2024

(51) Int. Cl.
*G01R 19/155*    (2006.01)
*G07C 5/08*      (2006.01)
*H01R 13/66*     (2006.01)

(52) U.S. Cl.
CPC ....... *G01R 19/155* (2013.01); *H01R 13/6616* (2013.01); *G07C 5/0808* (2013.01)

(58) Field of Classification Search
CPC .... G01R 19/00; G01R 19/145; G01R 19/155; G07C 5/00; G07C 5/08; G07C 5/0808; H01R 13/00; H01R 13/66; H01R 13/6608; H01R 13/6616
USPC ............................................. 324/76.11, 126
See application file for complete search history.

(56) References Cited

U.S. PATENT DOCUMENTS

| 5,572,143 A * | 11/1996 | Myers ............. G01R 19/16557 |
| | | 324/555 |
| 9,056,392 B2 * | 6/2015 | Anderson ............. B25G 1/085 |
| 9,059,541 B2 * | 6/2015 | Huang ................. H01R 13/648 |
| 11,001,159 B2 * | 5/2021 | Lee ........................ H02J 50/60 |

(Continued)

FOREIGN PATENT DOCUMENTS

| CN | 109696621 A | * | 4/2019 | .......... G01R 31/327 |
| CN | 106828107 B | * | 2/2023 | ............ B60L 3/0023 |

OTHER PUBLICATIONS

International Search Report, PCT/US24/24902, mailed Aug. 12, 2024, 10 pages.

*Primary Examiner* — Hoai-An D. Nguyen
(74) *Attorney, Agent, or Firm* — Scully Scott Murphy & Presser PC

(57) ABSTRACT

A high voltage measurement port and a circuit contact wire assembly for vehicle high-voltage power decommissioning. The high voltage measurement port includes four externally accessible pins for obtaining an electrical characteristic measurement of a connected circuit. For redundancy, the assembly includes a resistor between a first measurement port pin and a first positive DC busbar at a first location, a resistor between a second pin and the first DC busbar at a second location different from the first location, a resistor between a third pin and a second negative DC busbar at a first location, and a resistor between a fourth pin and the second DC busbar at a second location different from the first location. Via the high voltage measurement port, a multi-meter can verify each resistance connection between the positive pins and then again between negative pins before a differential voltage measurement is made between positive and negative.

19 Claims, 7 Drawing Sheets

(56) References Cited

U.S. PATENT DOCUMENTS

| | | | |
|---|---|---|---|
| 2015/0303737 A1* | 10/2015 | Steinbuchel, IV | B60L 53/65 |
| | | | 320/109 |
| 2016/0124028 A1 | 5/2016 | Staudenmaier | |
| 2018/0113157 A1 | 4/2018 | Gross et al. | |
| 2018/0356454 A1 | 12/2018 | Burkman et al. | |
| 2022/0360032 A1* | 11/2022 | Bays | B60R 16/03 |
| 2024/0017622 A1 | 1/2024 | Brikell et al. | |

* cited by examiner

REDUNDANT VERIFIABLE HIGH VOLTAGE MEASUREMENT PORT FOR TRACTION INVERTER AND HIGH VOLTAGE DISTRIBUTION

FIELD OF THE DISCLOSURE

This disclosure relates to safety features for vehicles such as battery electric vehicles and hybrid electric vehicles and more particularly, to a high voltage safety device in the form of a test portal for verifying an absence of voltage.

BACKGROUND

Currently, in electrical apparatuses employing high voltage power supplies, storage systems, circuits and related equipment, electrical connectors designed for such applications must accommodate particular safety requirements.

While one mechanism to ensure safety in the case that a high voltage connector to a storage system is to be disconnected while the power is still on is the implementation of a finger proof connector, or a high voltage interlock (HVIL) circuit feature, such an HVIL circuit that implements a low-voltage "loop" to monitor the integrity of a high-voltage circuit and is a separate closed circuit that is built into the connector design.

It would be advantageous to employ an increased safety redundancy feature to ensure user safety, e.g., when decommissioning a hybrid vehicle and/or when disconnecting high voltage or accessing line replaceable units (LRU)s.

SUMMARY

Accordingly, disclosed is a measurement circuit that includes a high voltage port that is externally accessible to allow a maintainer to verify that high voltage is not present on the high voltage system before accessing it or working on it.

In an aspect, the high voltage port uses two resistors per line where a standard measurement port uses one resistor per line. Each resistor is wired independently to a location on a DC bus so that a resistance measurement can be made between the resistors to verify electrical connection. This is essentially a manual test that the high voltage measurement port can be trusted.

In an aspect of the disclosure, there is provided a measurement system in an electric vehicle. The measurement system comprises: an electrical connector, the electrical connector including a body with one or more power terminals forming a measurement port adapted for external access; a first wire having a first end electrically coupled to a corresponding first power terminal of the measurement port and a second end configured to connect to a first electrical component of a circuit assembly; a second wire having a first end electrically coupled to a corresponding second power terminal of the measurement port and a second end configured to connect to the first electrical component of the circuit assembly; a third wire having a first end electrically coupled to a corresponding third power terminal of the measurement port and a second end configured to connect to a second electrical component of the circuit assembly; and a fourth wire having a first end electrically coupled to a corresponding fourth power terminal of the measurement port and a second end configured to connect to the second electrical component of the circuit assembly, each the first wire, second wire, third wire and fourth wire having an in-series resistor device connected between respective first and second ends.

In a further aspect, in the measurement system, the first electrical component is a positive direct current (DC) power bus bar for sourcing/distributing a positive DC voltage and the second electrical component is a negative DC power bus for bus sourcing/distributing a negative DC voltage.

In an embodiment, the second end of the first wire is configured to electrically connect to the first electrical component at a first location, and the second end of the second wire is configured to electrically connect to the first electrical component at a second location.

In a further embodiment, the second end of the third wire is configured to electrically connect to the second electrical component at a first location, and the second end of the second wire is configured to electrically connect to the second electrical component at a second location.

Further the body is configured to obtain a measurement at one or more power terminals, one or more the power terminals providing a signal indicative of a powered state of the first and second the electric components.

Embodiments of the invention will be described in more detail below, by way of illustrative and non-limiting examples, with reference to the accompanying drawings.

DETAILED DESCRIPTION

In accordance with aspects of the disclosure, there is provided a high voltage measurement port for a high voltage direct current (DC) power distribution system, e.g., provided in a hybrid vehicle. In embodiments, the high voltage measurement port is implemented for use in a traction inverter/battery or an electric vehicle distribution with redundant resistors for enhanced safety.

Figure 1A:
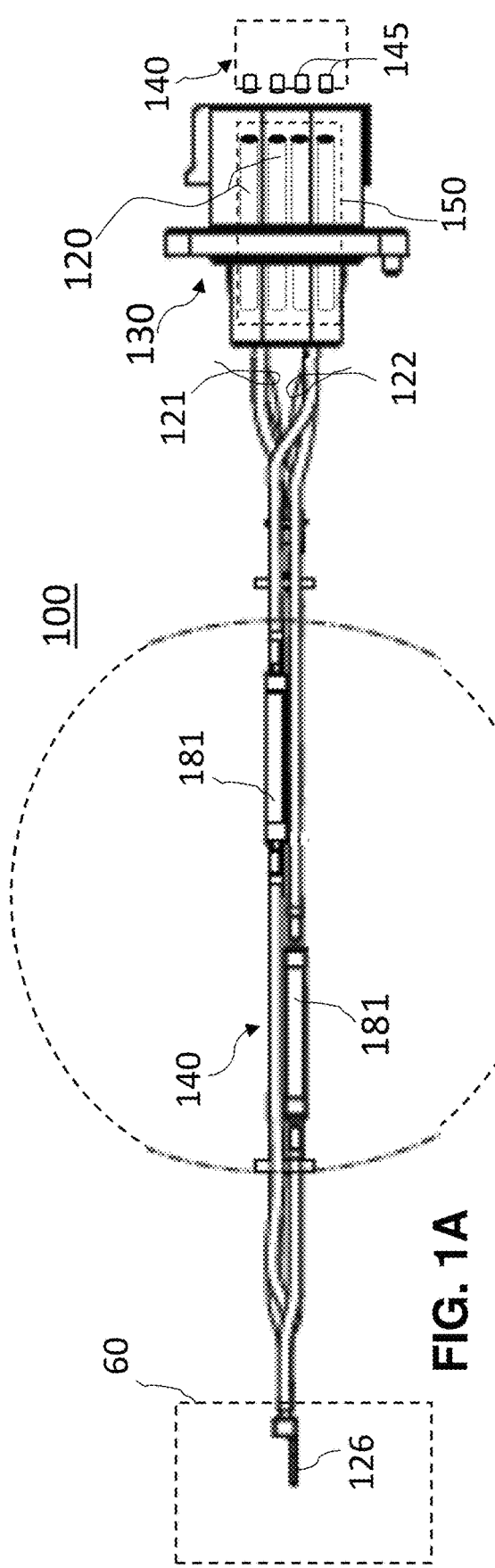
FIG. 1A shows a side view high-voltage connector system for a traction inverter and high voltage distribution system.

FIG. 1A shows a side view high-voltage connector system 100 for a vehicle high voltage DC power distribution system. The high-voltage connector system 100 includes an assembly having, at one end, a "plug-in" electrical connector or electrical measurement port ("electrical port") 150 within a high voltage terminal housing structure 130. Electrical port 150 is configured with (male or female) electrical terminal connections 120 for coupling to complementary (female or male) mating terminals 145 of a corresponding mating connector 140 for electrically connecting to a high-voltage load, e.g., an electrical machine or drive motor of a hybrid vehicle (not shown). The electrical port 150 is housed within a "plug-in" high voltage terminal housing structure 130 with each terminal connection 120 connecting to a corresponding individual wire, e.g., wires 121, 122 at an opposite end. These wires 121, 122 form a wire assembly 140. At a terminal end of each wire 121, 122 is a conductive metal terminal connector such as a copper terminal ring tongue connector or one-hole lug 126 configured to connect or couple to a high voltage terminal or like mounting structure (not shown) at a power source 60, e.g., a traction inverter or battery of a hybrid vehicle. In an embodiment, electrical port 150 can be a high voltage measurement port.

Figure 1B:
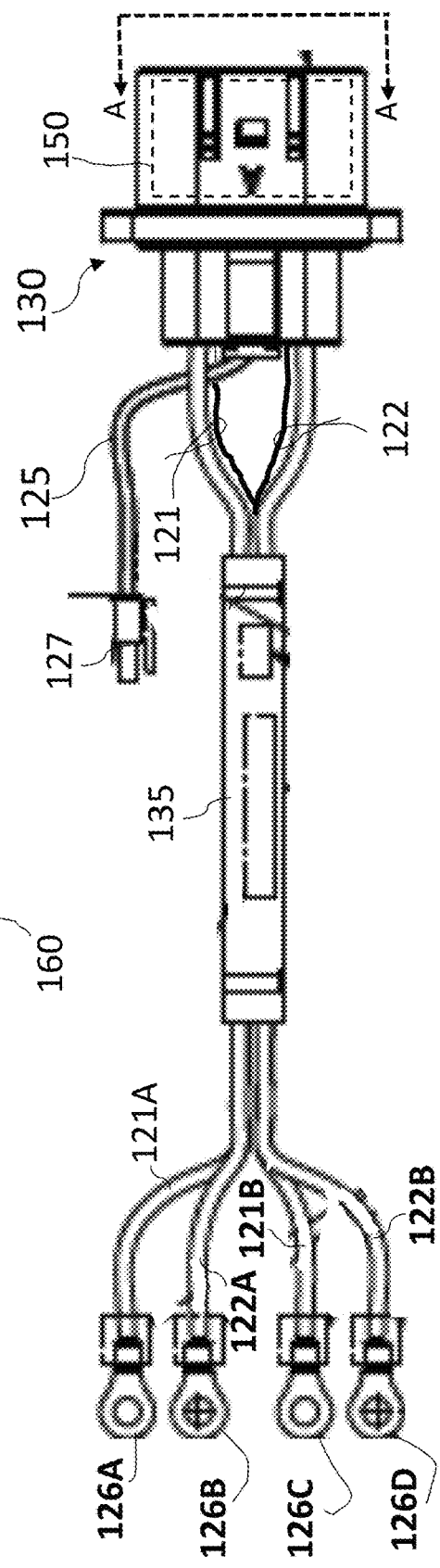
FIG. 1B shows an elevation view of the high-voltage connector system of FIG. 1A.

FIG. 1B shows an elevation view of the high-voltage connector system 100 of FIG. 1A and particularly, depicting an assembly that includes a sealed, plastic housing structure 130 housing the plug-in connector port 150 that include (male/female) terminals with each respective terminal (not shown) connecting to a corresponding wire 121, 122. In particular, plug-in connector port 150 includes at least four high voltage terminals (e.g., female connectors) that each electrically connect to respective four conductive copper wires such as wires 121A, 121B, 122A, 122B. In an embodiment, conductive wires 121A, 121B, 122A, 122B are 14 AWG standard wire gauge that can accommodate the high-voltages of a hybrid vehicle high-voltage/power system, e.g., of a gauge designed to handle up to 1000 VDC and can be oversized for mechanical robustness.

In an example embodiment, as shown in FIG. 1B, for connection redundancy, a first terminal connector (not shown) in port 150 connects to wire 121A having one-hole lug connector 126A at an opposite end; a second terminal connector (not shown) in port 150 connects to wire 121B having one-hole lug connector 126C at an opposite end; a third terminal connector (not shown) connects wire 122A having one-hole lug connector 126B at an opposite end, and a fourth terminal connector (not shown) connects wire 122B having one-hole lug connector 126D at an opposite end. In an example, one-hole lug wire end connectors 126A, 126B of corresponding wires 121A, 122A connect to positive terminals of the traction battery while one-hole lug wire end connectors 126C, 126D of corresponding wires 121B, 122B connect to negative/ground terminals of the traction battery.

In an alternate embodiment, for redundancy, wires 121A, 121B and corresponding respective one-hole lugs 126A, 126C connect to two separate positive terminals at the DC voltage bus which is typically at the voltage of the traction battery while wires 122A, 122B and corresponding respective one-hole lugs 126B, 126D connect to two separate negative/return terminals of the DC bus traction battery. In this embodiment, in the event of a failed battery contactor, the DC bus may be at traction battery voltage even when the battery system is shutdown. As further shown in FIG. 1B, wires 121A, 121B have a portion encased within an insulative sheath, wire shielding (or sleeve) 35 while corresponding wires 122A, 122B have a portion encased within a like insulative sheath or sleeve 36. The sleeve 36 is of a material that is cut resistant and abrasion resistant.

In a further embodiment, within plastic housing structure 130 are terminal connections (not shown) for mating with a high-voltage interlock loop circuit (not shown) that monitors the high voltage connection status of the vehicle to protect handlers of the high-voltage connections/components. As shown in FIG. 1B, exiting from a rear portion of the housing structure 130 is a further wire 125 having a high voltage interlock (HVIL) connector plug structure 127 configured with wire connections that plug into a low voltage signal circuit card to complete an HVIL circuit system for the high voltage distribution components (i.e., loops the HVIL back into a circuit board). In an embodiment, wire 125 connecting the high-voltage measurement port 150 to HVIL circuit (not shown) can be of a wire gauge thickness AWG 20. The HVIL low voltage signal circuit card (not shown) generates a low voltage signal that can be measured to monitor the high-voltage connectors. If the low-voltage HVIL signal is interrupted such as when a high voltage electrical connection becomes loose, disconnected or damaged, a circuit breaker of the high-voltage interlock loop (not shown) is triggered to generate an alarm or warning.

Figure 1C:
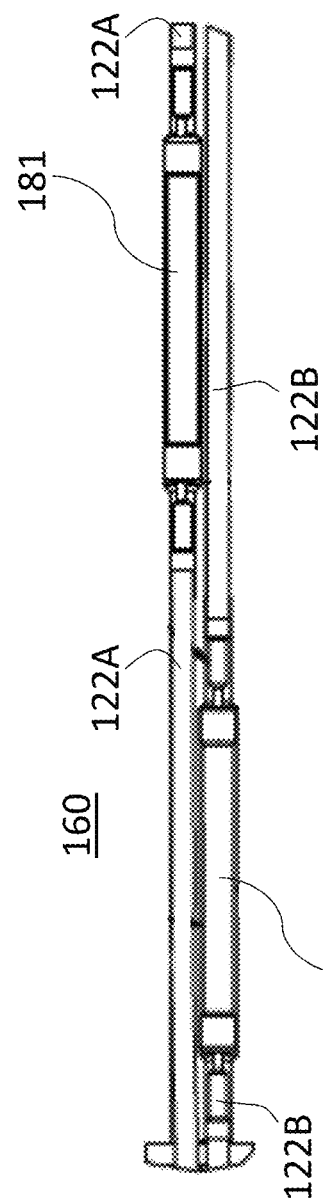
FIG. 1C shows a detailed close-up portion of the wire connectors of the wire assembly depicted in FIG. 1A.

In an embodiment, each high voltage wire connector 121A, 121B, 122A, 122B includes a corresponding in-series resistor component for limiting current flow to protect users when handling high voltage components. The provision of in-series resistor on each line also provides the means to verify that the voltage port can be trusted when a measurement is conducted. That is, a manual ohmmeter or multimeter resistance measurement can be conducted to verify that the resistance measurement between two positive battery terminals connecting wires 121A, 121B is two times the resistance values of resistor 181 (e.g., 2×500 kohms=1 Mohm) and similarly, that the resistance measurement between two negative battery terminals connecting wires 122A, 122B is two times the resistance values of resistor 181. Thus, by measuring the expected 2× resistance value of resistor 181, it is verified that the positive (+'ive) and negative (−'ive) terminals can be trusted in a voltage mode as the resistance measurement verify the continuity to the DC bus bars. FIG. 1C, in particular, shows a portion 160 of the wire connectors 121, 122 of wire assembly 140 depicted in FIG. 1A. In the detailed view of FIG. 1C, each respective wire, e.g., wire 121A, 122A, includes a respective hardwire connection to a corresponding in-series resistor 181. Although not shown in the detailed view of FIG. 1C, each other respective wire of assembly 140, e.g., wires 121B, 122B, includes a respective hardwire connection to a corresponding in-series resistor. Each connected in-series resistor 181 can be of a resistance value selected so that it is large enough to prevent hazardous shock levels. For example, as 2 mA is considered a limit where only a slight sensation can be felt by a user, then at 1000V DC the resistance value of each resistor 181 would be 500 kohms. In an embodiment, the resistance value is selected so that it is small enough to not impact the voltage reading made by a digital multi meter which may have an input impedance of approximately 10 Mohms. For example, a 1.0 Mohm resistance will impact a 10 Mohm input impedance voltage reading by 1/(1+10) or approximately 10% error. The resistance value of the in-series resistor 181 should be the smallest possible resistor that still prevents shock hazard in order to have the most accurate voltage reading.

Figure 2:
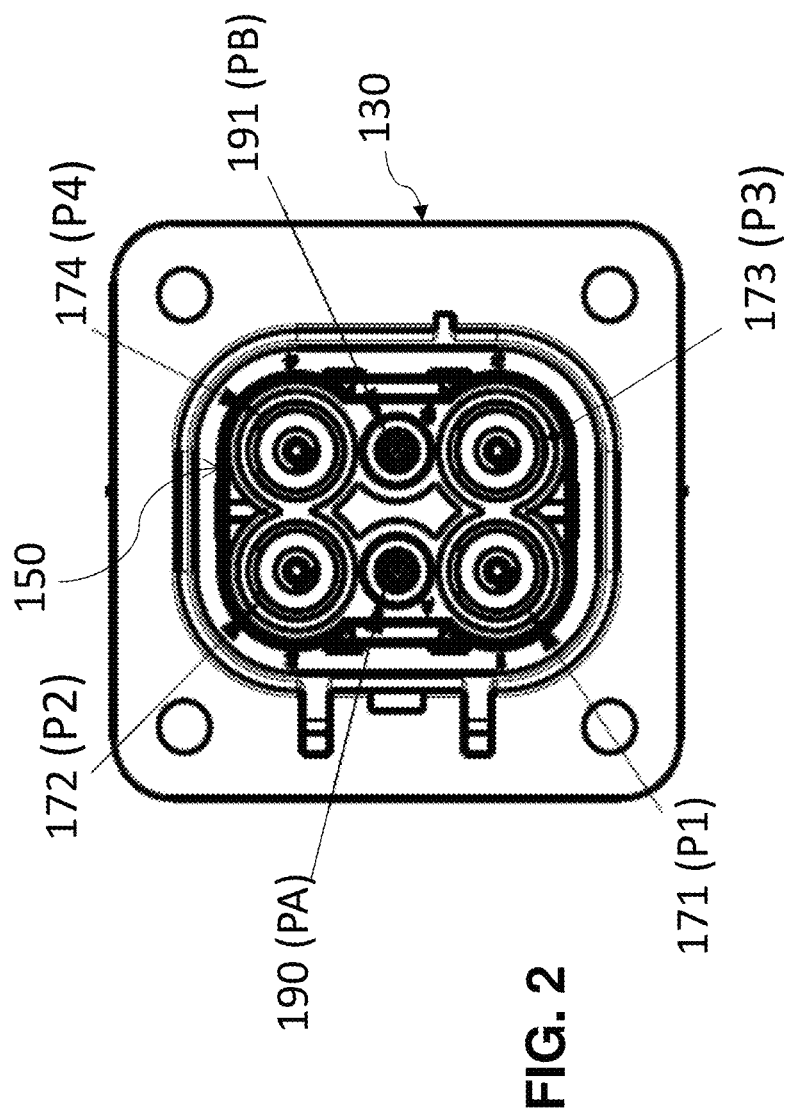
FIG. 2 depicts a front detailed view of the plug-in terminal connections electrical port housed in high voltage terminal housing such as in the embodiments of FIG. 1A.

Continuing to FIG. 2 there is depicted an enlarged front detailed view of the plug-in terminal connections electrical port 150 housed in high voltage terminal housing 130 such as taken along the view of line A-A in the embodiments of FIG. 1B. The plug-in electrical port 150 includes plural female plug-in high-voltage electrical terminal connections 171, 172, 173, 174 including corresponding respective "pins" P1, P2, P3, P4. Referring back to FIG. 1B, in an embodiment, plug-in, high-voltage electrical terminal connection 171 corresponds to a first pin (P1) connecting a first wire 121A having end connector 126A for accommodating connection to a positive high voltage (HV+ 1) terminal of a traction inverter or battery; plug-in electrical terminal connection 172 corresponds to a second pin (P2) connecting a wire 121B having end connector 126C for accommodating connection to a negative or return high voltage (HV− 1) terminal. Similarly, plug-in electrical terminal connection 173 corresponds to a third pin (P3) connecting a wire 122A having end connector 126B for accommodating connection to a second positive high voltage (HV+ 2) terminal of a traction inverter or battery; and plug-in electrical terminal connection 174 corresponds to a fourth pin (P4) connecting wire 122B having wire end connector 126D for accommodating connection to a negative or return high voltage (HV− 2) terminal of a traction inverter or battery. Additionally shown in FIG. 2 are HVIL circuit pin connections including a first pin 190 (pin "PA") and a second pin 191 (pin "PB").

In an embodiment, the electrical measurement port 150 of FIGS. 1A-1C uses two (2) resistors, e.g., resistor 181, per line, where a standard measurement port uses one resistor per line. Each resistor is wired independently to a location on the DC bus so that a resistance measurement can be made between the resistors to verify electrical connection. This is essentially a manual test that the high voltage measurement port can be trusted. Such a manual test can include probing the port connection at pins corresponding to the +'ive (positive) terminals at the DC bus to first ensure that a resistance measurement between the pins is two times (2×) the resistor value 181; and similarly probing the port connection at pins corresponding to the −'ive (negative) terminals at the DC bus to verify that the resistance measurement between the pins is also two times (2×) the resistor value 181.

Figure 3:
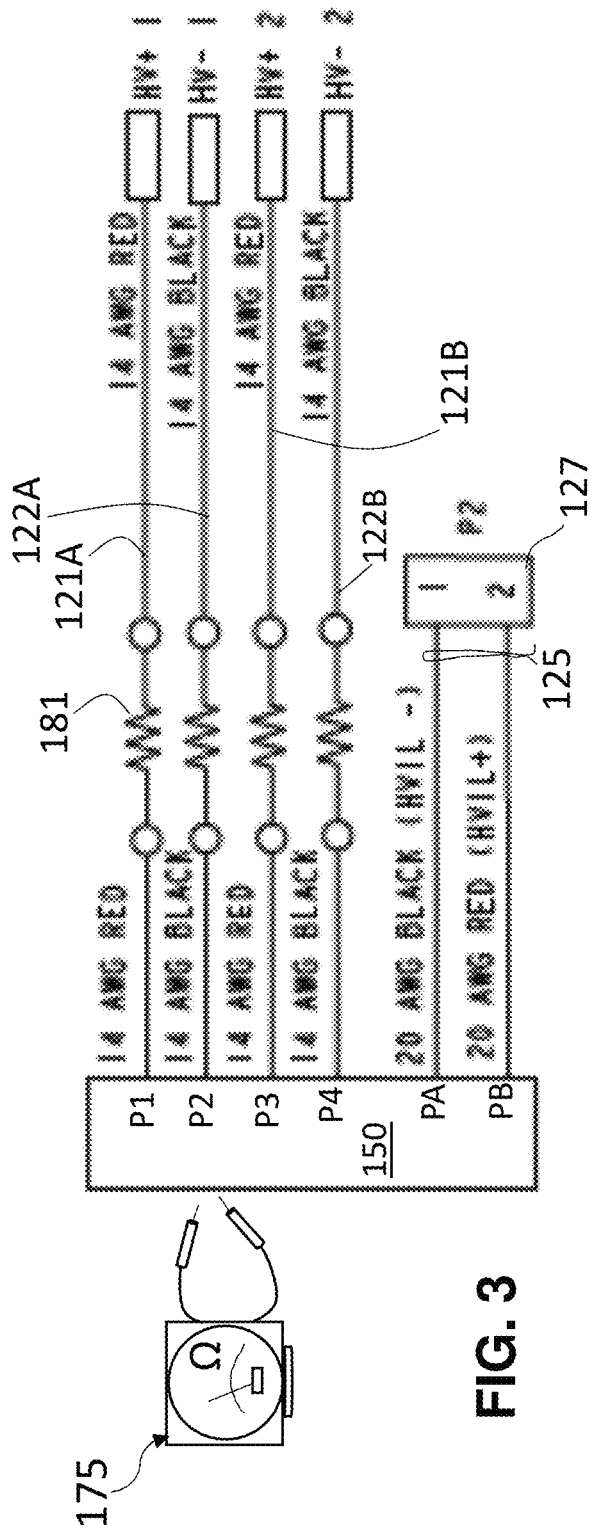
FIG. 3 depicts an electric circuit equivalent for using the high voltage electrical port of high voltage connector system as a measurement port, e.g., used for vehicle decommissioning a hybrid vehicle.

FIG. 3 depicts an electric circuit equivalent for using the electrical port 150 of high voltage connector system as a measurement port, e.g., used for vehicle decommissioning a hybrid vehicle. In such an embodiment, connection pin P1 wire 121A includes a series resistor 181 and connects with a first high voltage connector (HV+ 1) at the traction inverter or DC bus; connection pin P2 wire 122A includes a series resistor 181 and connects with a high voltage return connector (HV− 1) at the traction inverter or DC bus. Likewise, connection pin P3 wire 121B includes a series resistor 181 and connects with a second high voltage connector (HV+ 2) at the traction inverter or DC bus; and connection pin P4 wire 122B includes a series resistor 181 and connects with a high voltage return connector (HV− 2) at the traction inverter or DC bus. Further, HVIL circuit connection pin PA wire 125 connects directly via plug 127 with a first high voltage interlock circuit connector (HVIL−) at the hybrid vehicle and circuit connection pin PB wire 125 directly connects via plug 127 to a high voltage return connector (HVIL+)

When configured in such a manner, the measurement port uses a resistor between a pin and +'ive DC quantity 2 and a resistor between a pin and −'ive DC quantity 2. Where each connection can be verified between the positive pins in ohm setting on digital multi-meter and then again between negative pins before a differential voltage measurement is made between positive and negative. Thus, it may be verified that the connections to the DC bus are made by measuring 2R and then you can trust a +'ive pin to −'ive measurement is valid in voltage mode on meter.

Figure 4:
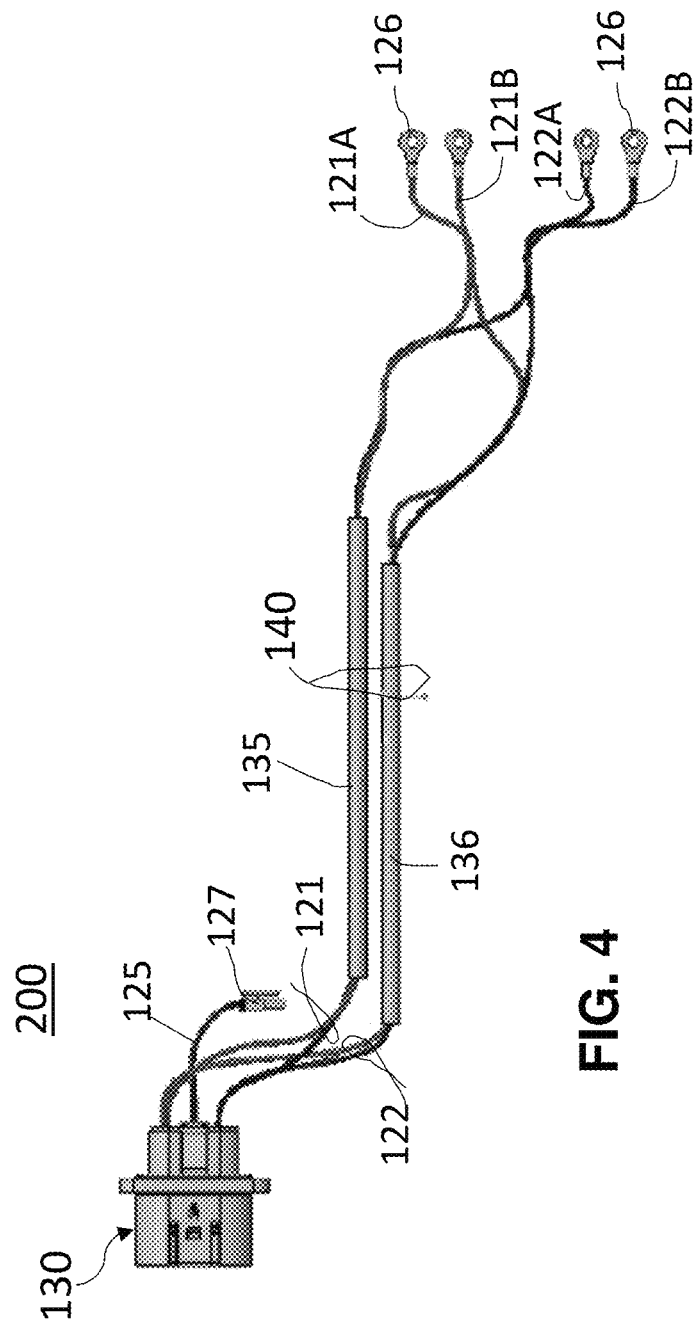
FIG. 4 depicts an embodiment of a high-voltage connector system corresponding to the assembly shown in the configuration of FIGS. 1A, 1B.

FIG. 4 depicts an embodiment of a high-voltage connector system 200 corresponding to the assembly 10 shown in the configuration of FIGS. 1A, 1B including separated sleeves 135, 136 for conveying wires 121A, 122A and 121B, 122B respectively, where wires 121A, 122A carried by sleeve 135 connect to respective DC bus connections HV+ 1, HV− 1 and wires 121B, 122B carried by sleeve 136 connect to respective DC bus connections HV+ 2, HV− 2. It is understood that wires 121A, 121B can be carried together by a single sleeve for connection to DC bus connections HV+ 1, HV+ 2 while wires 122A, 1223 can be carried together by another single sleeve where wires 122A, 122B, connect to DC bus connections HV− 1, HV− 2. However, preferably, the +'ive connection wires 121A, 121B are routed in separate sleeves because if the +'ive wires between their respective resistors and the DC bus were to short out it would defeat the resistance continuity check. Likewise, the −'ive terminal connected wires 122A 122B. are routed in separate sleeves because if the −'ive wires between their respective resistors and the DC bus were to short out it would defeat the resistance continuity. By routing the +'ive and −'ive wires together but separately from the other pair, shorts within these wires bundles can be detected with the resistance continuity checks.

Figure 5:
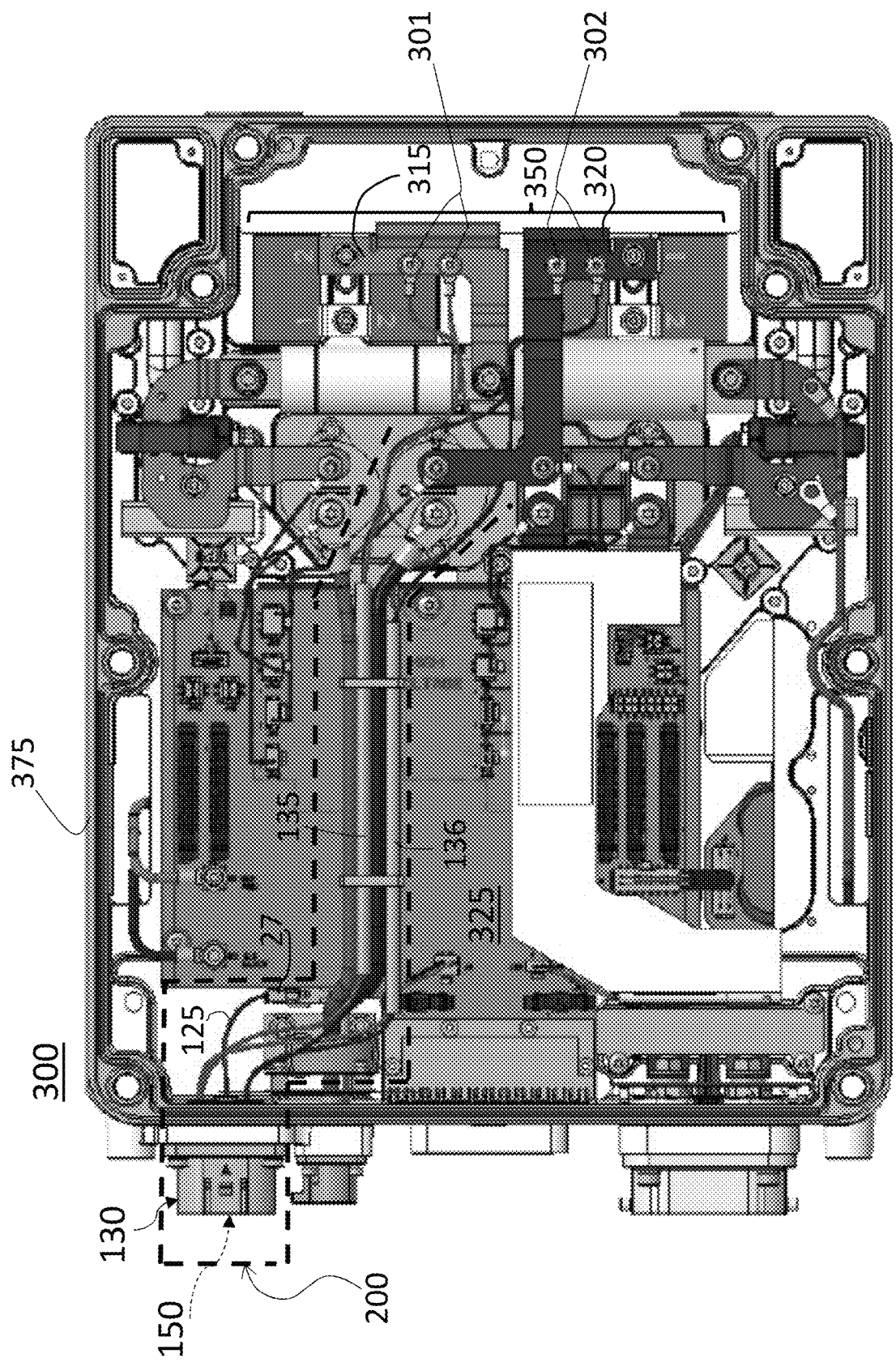
FIG. 5 depicts an embodiment of a DC interface module of a hybrid vehicle including an integration of the high-voltage connector assembly commensurate with the configuration of FIG. 4.

FIG. 5 depicts an embodiment of a portion of a hybrid vehicle DC interface module 300 configured for use in a modular power control system (MPCS) of a hybrid vehicle. The MPCS is a modular line replaceable unit (LRU) containing a plurality of inverters modules and high voltage power distribution. The MPCS is scalable and customizable to have any number of inverters modules and current interfaces.

In an embodiment, DC interface module 300 is an assembly that provides a plurality of DC interfaces configured to receive DC power from an external source. For example, the DC interface module 300 provides connections to energy storage systems and with additional expansion DC modules can provide N connections to energy storage systems which are potential sources of dangerous voltage when decommissioning a high voltage system. The DC interface module 300 may also include isolation monitoring and control of high voltage power distribution and low voltage power distribution in the MPCS. The DC interface module 300 may comprise multiple contactors, busbars 315, 320 and fuses. The DC interface module 300 may also comprise a DC interface card 325, a power supply card and capacitors. The DC interface card 325 is configured to drive contactors, for high voltage monitoring and high voltage interlock and can control contactors and can measure HVIL, DC voltages and DC currents. In an embodiment, the HVIL connector plug structure 27 is adapted to connect the DC voltage circuit card 325 to complete an HVIL circuit system for the high voltage distribution components.

As shown in FIG. 5, hybrid vehicle DC interface module 300 integrates the high-voltage connector assembly 200 including a high voltage measurement port 150 commensurate with the configuration depicted in FIG. 4. In FIG. 5, the housing 130 including the measurement port 150, is shown flush-mounted to an edge of a framing or housing structure 375 housing printed circuit boards and other components of the DC interface module 300. The housing 130 and measurement port 150 is mounted to the DC interface module 300 such that the measurement pins inside measurement port 150 are externally accessible to obtain measurements by probing of the pins using a measurement device (e.g., DMM 175 of FIG. 3). In an embodiment, the probing of pins at the measurement port 150 is used to ascertain a voltage state of the hybrid vehicle, e.g., whether high-voltage power is still being distributed or not. Such a determination is made to ensure that high voltage is not present on the high voltage system before a user can work on the system. In FIG. 5, the DC interface module 300 includes DC bus bar structures 350 including a first bus bar 315 for sourcing/distributing a positive DC voltage and a second bus bar portion 320 providing/distributing a negative (sink) DC voltage for use by the vehicle motor drive circuitry. In FIG. 5, high-voltage connector assembly wires 121A, 121B of the connector assembly 200 connect to positive DC voltage terminal connections 301 at positive DC voltage bus bar 315 and high-voltage connector assembly wires 122A, 122B of connector assembly 200 connect to negative DC voltage terminal connections 302 at negative DC voltage terminal bus bar 320.

The integrated high voltage measurement port 150 integrated at the DC interface module 300 is implemented for a measurement to ensure that high voltage is not present on the high voltage system before a user can work on the system. That is, as high voltage systems on heavy duty vehicles can be dangerous to a maintainer in the event that a contactor is welded in the energy storage system and the maintainer is un-aware when disconnecting high voltage or accessing LRUs, the measurement port allows the maintainer to verify that high voltage is not present on the high voltage system before working on it. In an embodiment, via the high voltage measurement port, a multi-meter can verify each resistance connection between the positive pins and then again between negative pins before a differential voltage measurement is made between positive and negative.

In this embodiment, the high voltage measurement port uses two (2) resistors per line where a standard measurement port uses one resistor per line. The large capacitance between +'ive and –'ive terminals connections makes it difficult/impossible to accurately measure resistance differentially so a single resistor on high and low will not work. Each resistor is wired independently to a location on the DC bus 315. In an embodiment, a resistance measurement can be made between the resistors to verify electrical connection. This is essentially a manual test that the high voltage measurement port can be trusted to be connected to the DC bus.

Figure 6:
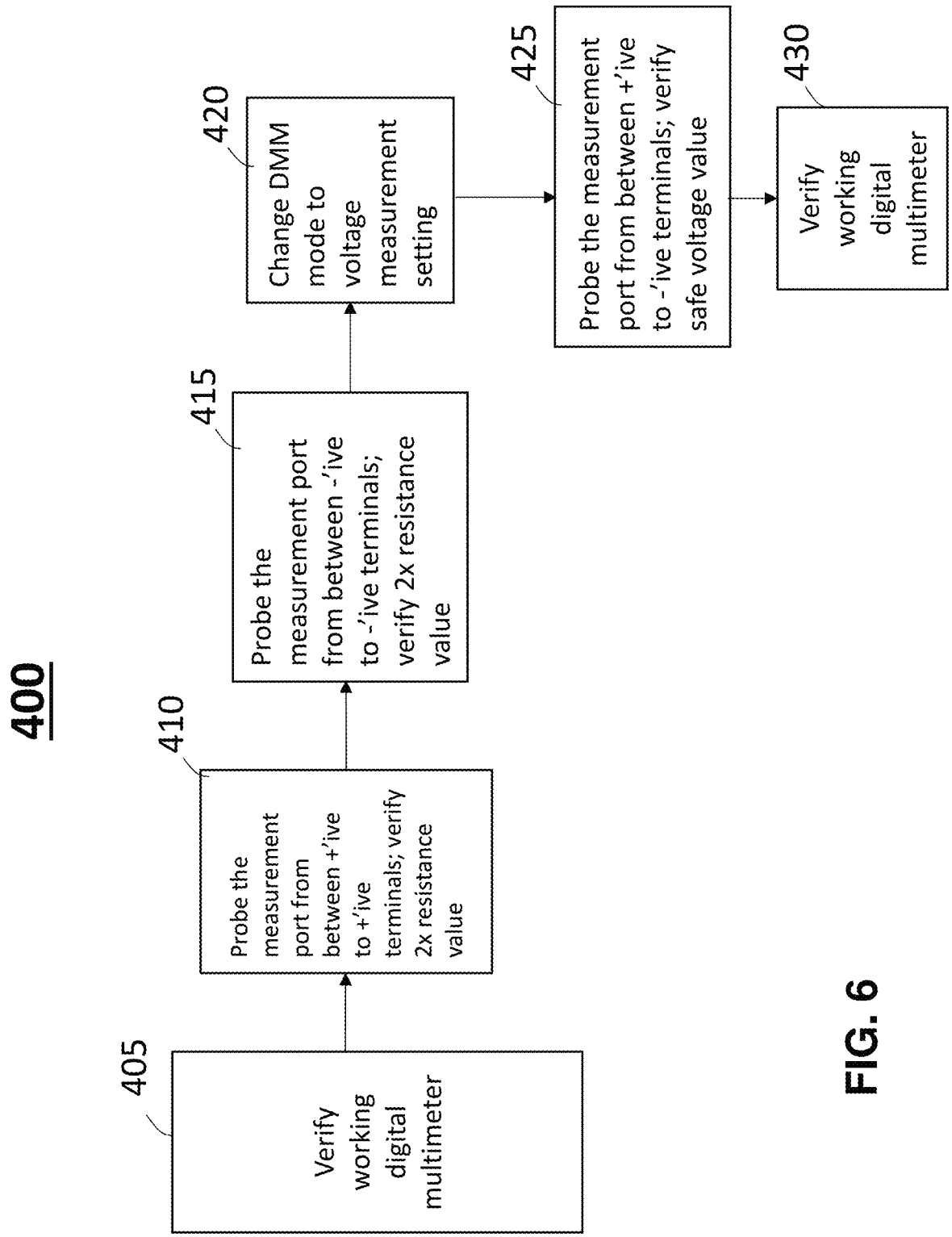
FIG. 6 depicts a measurement method for ensuring safety of a maintainer while handling, e.g., decommissioning, a hybrid vehicle.

FIG. 6 depicts a measurement method for ensuring safety of a maintainer while handling, e.g., decommissioning, a hybrid vehicle.

In the method, a first step 405 is to ensure a Digital Multimeter (DMM) works. To this end, a user can put the DMM meter 175 (FIG. 3) onto a known voltage source to verify the DMM, for example, by probing a SLI (starter lighting ignition) battery +'ive and –'ive terminals with the DC multimeter set to VDC. The multimeter should read the expected vehicle SLI battery voltage of about 12 VDC to prove the meter works.

A next step 410 involves setting the DMM 175 to a resistance measurement mode and probing the measurement port 150 from between +'ive to +'ive terminals because each +'ive pin connects through the in-series resistor 181, e.g., 500 kohm resistor. As each DMM probe connects only at a DC positive bus, it is known that the connection is made to the DC positive bus if the resistance reads 1 Mohm (e.g., 2×500 kohms).

Then, at 415, the method repeats the previous step however by probing the negative terminals and confirm a 1 Mohm resistance reading. That is, the DMM is used to probe the measurement port 150 from between –'ive to –'ive terminals. As each –'ive pin connects through the in-series resistor 181, e.g., 500 kohm resistor and each DMM probe connects only at a DC negative bus, it is known that the connection is made to the DC negative bus if the resistance reads 1 Mohm (e.g., 2×500 kohms).

Then, at 420, the method involves changing the DMM meter to VDC mode, and at 425, verifying that a voltage measured between +'ive and –'ive terminals at the high-voltage measurement port is a safe voltage (e.g., <50V) noting that there could be a 10% error in the voltage reading due to the in-series 500$k$ resistors.

Then, at step 430, the DMM measurement of the SLI battery can then be repeated again to confirm meter is still functioning after verifying safe voltage.

Once an absence of a voltage is confirmed, the system can be safely disconnected/disassembled.

Thus, the high voltage measurement port 150 for vehicle decommissioning includes a respective first and second resistor between a respective pin and the +DC busbar and a respective first and second resistor between a respective pin and the –DC busbar. Each connection can be verified between the positive pins in an ohm setting on digital multi-meter device 175 and then again between negative pins before a differential voltage measurement is made between positive and negative pin terminals.

The high-voltage connector system 200 with high voltage measurement port for traction inverter and electric vehicle DC power distribution with redundant resistors makes the MPCS and vehicle system safer. The vehicle system may be used in hybrid electric vehicle (HEV) or a battery electric vehicle (BEV). The vehicle may be a personal vehicle, such as a scooter, car, motorcycle and truck or a commercial vehicle such as a truck or bus, a maritime vehicle such as a boat or submarine or a military vehicle such as a tank, self-propelled artillery, or troop transport. The vehicle may also be an airplane, helicopter, UAV, and other powered air vehicles.

In the discussion and claims herein, the term "about" indicates that the value listed may be somewhat altered, as long as the alteration does not result in nonconformance of the process or device. For example, for some elements the term "about" can refer to a variation of ±0.1%, for other elements, the term "about" can refer to a variation of ±1% or ±10%, or any point therein. For example, the term about when used for a measurement in mm, may include +/0.1, 0.2, 0.3, etc., where the difference between the stated number may be larger when the state number is larger. For example, about 1.5 may include 1.2-1.8, where about 20, may include 18.0-22.0.

As used herein, the term "substantially", or "substantial", is equally applicable when used in a negative connotation to refer to the complete or near complete lack of an action, characteristic, property, state, structure, item, or result. For example, a surface that is "substantially" flat would either completely flat, or so nearly flat that the effect would be the same as if it were completely flat. "Substantially" when referring to a shape or size may account for manufacturing where a perfect shapes, such as circular or sizes may be difficult to manufacture.

As used herein terms such as "a", "an" and "the" are not intended to refer to only a singular entity, but include the general class of which a specific example may be used for illustration. As used herein, terms defined in the singular are intended to include those terms defined in the plural and vice versa.

References in the specification to "one aspect", "certain aspects", "some aspects" or "an aspect", indicate that the aspect(s) described may include a particular feature or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

For purposes of the description hereinafter, the terms "upper", "lower", "right", "left", "vertical", "horizontal", "top", "bottom", and derivatives thereof shall relate to a device relative to a floor and/or as it is oriented in the figures or with respect to a surface.

The terminology used herein is for the purpose of describing particular embodiments only and is not intended to be limiting the scope of the disclosure and is not intended to be exhaustive. Many modifications and variations will be apparent to those of ordinary skill in the art without departing from the scope and spirit of the disclosure.

What is claimed is:

1. A measurement system in an electric vehicle comprising:
   an electrical connector, the electrical connector including a body with one or more power terminals forming a measurement port adapted for external access;
   a first wire having a first end electrically coupled to a corresponding first power terminal of the measurement port and a second end configured to connect to a first electrical component of a circuit assembly;
   a second wire having a first end electrically coupled to a corresponding second power terminal of the measurement port and a second end configured to connect to the first electrical component of the circuit assembly;
   a third wire having a first end electrically coupled to a corresponding third power terminal of the measurement port and a second end configured to connect to a second electrical component of the circuit assembly;
   a fourth wire having a first end electrically coupled to a corresponding fourth power terminal of the measurement port and a second end configured to connect to the second electrical component of the circuit assembly,
   each said first wire, second wire, third wire and fourth wire having an in-series resistor device connected between respective first and second ends.

2. The measurement system as claimed in claim 1, wherein said first electrical component is a positive direct current (DC) power bus for sourcing/distributing a positive DC voltage and said second electrical component is a negative direct current (DC) power bus for sourcing/distributing a negative DC voltage.

3. The measurement system as claimed in claim 2, wherein the second end of said first wire is configured to electrically connect to said first electrical component at a first location, and the second end of said second wire is configured to electrically connect to said first electrical component at a second location.

4. The measurement system as claimed in claim 2, wherein the second end of said third wire is configured to electrically connect to said second electrical component at a first location, and the second end of said second wire is configured to electrically connect to said second electrical component at a second location.

5. The measurement system as claimed in claim 1, wherein the body is configured to obtain a measurement at one or more power terminals, one or more said power terminals providing a signal indicative of a powered state of the first and second said electric components.

6. The measurement system as claimed in claim 5, wherein the one or more power terminals forming a measurement port comprises: a further terminal adapted for connection to a high voltage interlock circuit connected to one or more said components of said electric vehicle.

7. The measurement system as claimed in claim 4, wherein a portion of the first wire and a portion of the third wire are physically enclosed together within a first sleeve, and a portion of the second wire and a portion of the fourth wire are physically enclosed together within a second sleeve, the first sleeve conveying the second ends of the first wire and third wire to the first electric component of the circuit assembly and the second sleeve conveying the second ends of the second wire and fourth wire to the second electric component of the circuit assembly.

8. The measurement system as claimed in claim 1, wherein the in-series resistor device connected between respective first and second ends resistors of the first wire and the in-series resistor device connected between respective first and second ends resistors of the second wire are in staggered arrangement within the first sleeve.

9. The measurement system as claimed in claim 1, wherein the in-series resistor device connected between respective first and second ends resistors of the third wire and the in-series resistor device connected between respective first and second ends resistors of the fourth wire are in staggered arrangement within the second sleeve.

10. The measurement system as claimed in claim 1, further comprising:
    a metered device for measuring an electrical characteristic between one or more said first power terminal through fourth power terminal, said electrical characteristic indicative of one of:
    a high voltage state of said circuit assembly or an off state of the circuit assembly.

11. A method for verifying safe access to components of a high voltage electrical circuit distribution assembly, said method comprising:
    probing, using an electrical circuit measurement device, an electrical connector including a body with one or more power terminals forming a measurement port adapted for external access, the measurement port comprising:
       a first wire having a first end electrically coupled to a corresponding first power terminal of the measurement port and a second end configured to connect to a first electrical component of the electrical circuit distribution assembly;
       a second wire having a first end electrically coupled to a corresponding second power terminal of the measurement port and a second end configured to connect to the first electrical component of the electrical circuit distribution assembly;
       a third wire having a first end electrically coupled to a corresponding third power terminal of the measurement port and a second end configured to connect to a second electrical component of the electrical circuit distribution assembly;
       a fourth wire having a first end electrically coupled to a corresponding fourth power terminal of the measurement port and a second end configured to connect to the second electrical component of the electrical circuit distribution assembly, each said first wire, second wire, third wire and fourth wire having a respective in-series resistor device connected between respective first and second ends; and
    said probing comprising, probing said electrical connector to measure a first resistance between said first power terminal and said second power terminal; and subsequently probing said electrical connector to measure a second resistance between said third power terminal and said fourth power terminal; and determining a safety of said electrical circuit distribution assembly based on values of said measured first resistance and said measured second resistance.

12. The method as claimed in claim 11, further comprising:

changing the electrical circuit measurement device to measure a DC voltage; and probing between the first power terminal and third power terminal to measure a first voltage therebetween, or probing between the second power terminal and fourth power terminal to measure a second voltage therebetween, the measured first voltage or measured second voltage verifying that the high-voltage measurement port is at a safe voltage.

13. The method as claimed in claim 11, wherein first resistance measured between said first power terminal and said second power terminal comprises: a resistance measurement between a first +'ive pin terminal and a second +'ive pin terminal of said port, said first +'ive pin terminal and second +'ive pin terminal respectively connected at respective second ends of respective first wire and second wires to the first electrical component of the electrical circuit distribution assembly at different locations.

14. The method as claimed in claim 13, wherein second resistance measured between said first power terminal and said second power terminal comprises: a resistance measurement between a third −'ive pin terminal and a fourth −'ive pin terminal of said port, said third −'ive pin terminal and fourth −'ive pin terminal respectively connected at respective second ends of respective third wire and fourth wires to the second electrical component of the electrical circuit distribution assembly at different locations.

15. The method as claimed in claim 14, wherein each respective connected in-series resistor device is of a value R, wherein an expected first resistance measurement value between said first power terminal and second power terminal to ensure safe access is approximately 2R and an expected second resistance measurement value between said third power terminal and fourth power terminal to ensure safe access is approximately 2R.

16. The method as claimed in claim 11, wherein the first electrical component of the electrical circuit distribution assembly is a positive direct current (DC) voltage bus for sourcing/distributing a positive DC voltage.

17. The method as claimed in claim 11, wherein the second electrical component of the electrical circuit distribution assembly is a negative DC voltage bus for sourcing/distributing a negative DC voltage.

18. The method as claimed in claim 11, wherein said high voltage electrical circuit distribution assembly is configured within a hybrid electric vehicle, said method ensuring a safety of a user subsequently handling the hybrid vehicle.

19. The method as claimed in claim 18, wherein said handling of the hybrid vehicle comprises a decommissioning of the hybrid electric vehicle.

* * * * *